(12) United States Patent
Kawakita

(10) Patent No.: US 6,220,875 B1
(45) Date of Patent: Apr. 24, 2001

(54) ELECTRICAL CONNECTION BOX

(75) Inventor: Shinji Kawakita, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/391,536

(22) Filed: Aug. 8, 1999

(30) Foreign Application Priority Data

Sep. 9, 1998 (JP) ................................................ 10-255721

(51) Int. Cl.$^7$ ............................. H01R 12/00; H05K 1/00
(52) U.S. Cl. .......................................... 439/76.2; 439/949
(58) Field of Search .................... 439/76.2, 949, 439/405

(56) References Cited

U.S. PATENT DOCUMENTS

| | | |
|---|---|---|
| 4,950,168 | 8/1990 | Watanabe et al. . |
| 5,057,026 | * 10/1991 | Sawai et al. ........................ 439/76.2 |
| 5,295,842 | 3/1994 | Ozaki et al. . |
| 5,327,643 | 7/1994 | Sakamoto et al. . |
| 5,782,651 | * 7/1998 | Konoya ............................... 439/405 |

FOREIGN PATENT DOCUMENTS

| | | |
|---|---|---|
| 0720256 | 3/1996 | (EP) . |
| 0824282 | 2/1998 | (EP) . |
| 2293052 | 3/1996 | (GB) . |
| 2318226 | 4/1998 | (GB) . |

OTHER PUBLICATIONS

European Search Report EP 99 11 7811 (No Date).
JP Patent Unexamined Publication No. 5–344632 (No Date).
JP Utility Model Unexamined Publication No. 5–78130 (No Date).
JP Utility Model Examined Publication No. 7–47935 (No Date).

* cited by examiner

*Primary Examiner*—Tulsidas Patel
*Assistant Examiner*—Brian S. Webb
(74) *Attorney, Agent, or Firm*—Bierman, Muserlian and Lucas

(57) ABSTRACT

An electrical connection box 1 containing at least one generally planar base insulative plate 4 having two flat surfaces. There is at least one busbar 5 on or adjacent the first surface which is capable of electrical contact with a plurality of insulated wires 6. The busbar has one or more pressure connection sections 10 which include a pair of blades 11 which cut through the insulation on the wires 6 and make electrical contact therewith. The insulated wires are straight, parallel to each other, and are located in the wire concentration section 15 which is on or adjacent the second surface of the base insulative plate 4. The wire concentration section 15 and the pressure connection section 10 are in register with each other and openings 17 are provided in the base insulative plate through which the blades 11 can project. Thus, when pressure is exerted on the blades 11 or on the insulated wires 6, the blades cut through the insulation on the wires, forming an electrical contact between the busbar 5 and the wires 6 in a single operation. It is unnecessary to insert the wires one at a time. This provides increased ease of assembly, reduces costs, and provides secure and reliable connections.

7 Claims, 3 Drawing Sheets

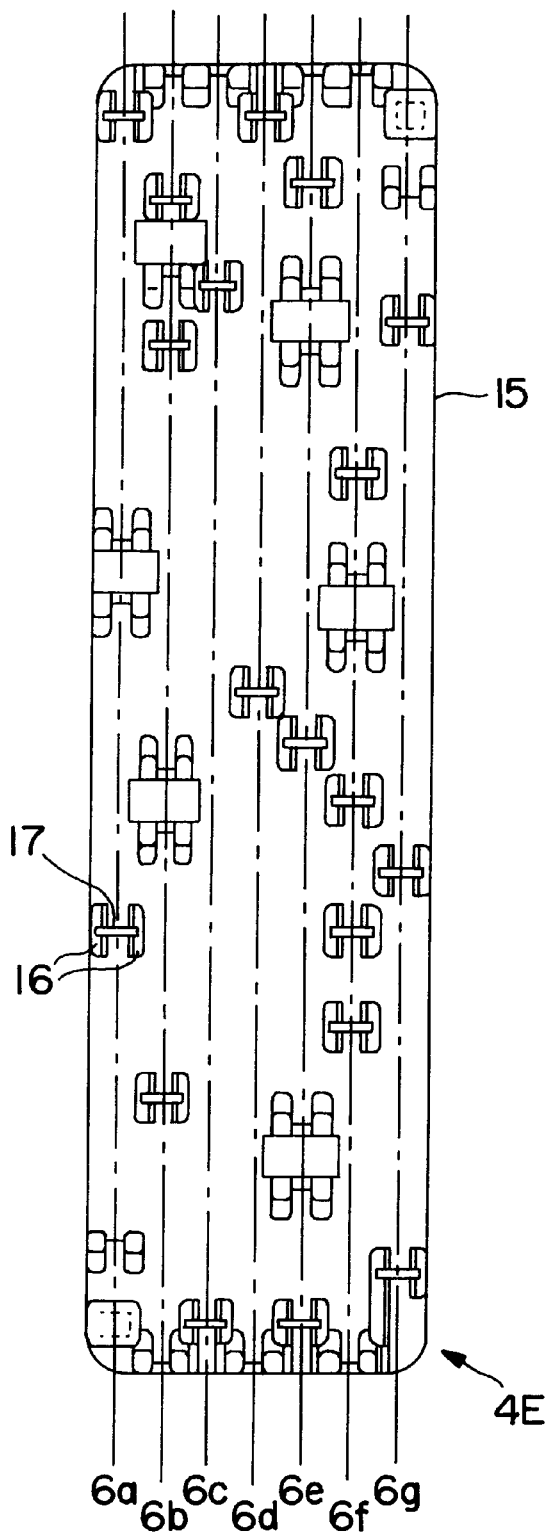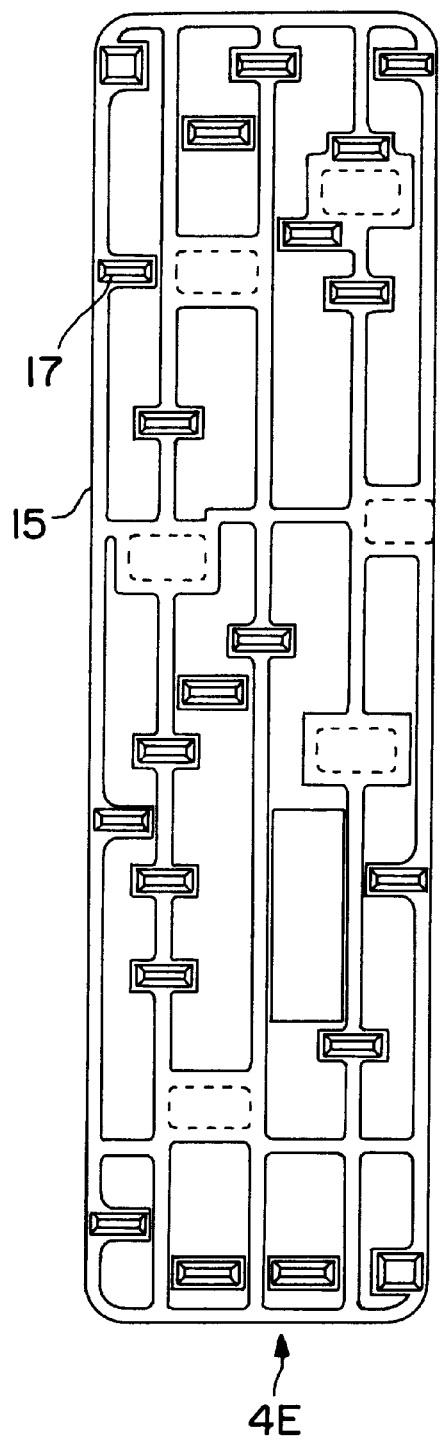
FIG. 2A
FIG. 2B

ELECTRICAL CONNECTION BOX

This Application claims the priority of Japanese Application 10-255,721, filed Sep. 9, 1998.

The present Invention is directed to an electrical connection box, particularly designed for use in automobiles. More specifically, it provides a high-density branching circuit wherein the wire connection section is on a busbar stacked on an insulative plate and the wire serves as an intermediate connection, thereby increasing the wire efficiency of the busbar. Preferably, the elements are within the electrical connection box. The Invention will be described with relation to an automobile, but its use is not limited thereto.

BACKGROUND OF THE INVENTION

In recent years, the number and diversity of electronic parts to be installed in automobiles has increased rapidly. As a result, the circuits contained in automotive electrical connection boxes have also been increased. In an attempt to form high density branch circuits, busbars and pressure-connections between the wire and the terminal have been used. As shown particularly in FIG. 3, busbars 7 and 8 are to be connected to each other. However, busbar 9 is located between them. In order to avoid electrical contact between busbars 7 and 8 and busbar 9, wire 6 is pressed between blades 11, thereby avoiding busbar 9 and securing the electrical connection between busbars 7 and 8.

As shown in FIG. 4, insulative plate 4D carries busbars 7 and 8. Connection sections 10 pass through openings 17 in insulative plate 4E and blades 11 cut through the insulation on wires 6 to make electrical contact with the cores thereof. A further modification is shown in FIG. 5, wherein insulative plate 4C carries busbar 9 and insulative plate 4D carries busbars 7 and 8. Connection section 10 of busbar 9 passes through opening 17 in insulative plate 4D and through opening 17 in insulative plate 4E. Since busbars 7 and 8 are resting on insulative plate 4D, connection sections 10 thereof only have to pass through openings 17 in insulation plate 4E. However, since busbar 9 rests on insulative plate 4C, section 10 passes through openings 17 in plates 4D and 4E.

However, the busbar method is such that an increased number of circuits in the connection box is accompanied by a decrease in the number of circuits which can be placed on a single layer. Thus, a greater number of layers must be provided, thereby making the connection box larger and more complex.

On the other hand, if pressure-connection methods are used, the circuit density is increased and design changes can be readily implemented; however, greater equipment costs result. In some cases, the two methods are combined. In such structures, busbar layers are stacked with layers formed from wires and pressure-connection terminals. These layers are connected to external circuits. However, this combined method results in higher production costs, creating problems in manufacture of low cost automobiles.

SUMMARY OF THE INVENTION

It is an object of the present Invention to provide a simple structure for the internal circuits in an electrical connection box, while permitting these circuits to be arranged in a highly dense configuration. It is also an object of the present Invention to provide such circuitry wherein the wires can be pressure-connected to the busbars at one time, the circuits can easily be changed and which results in a low-cost connection box suitable for mass production of inexpensive automobiles.

In practicing the present Invention, there is provided an electrical connection box containing at least one generally planar base insulative plate. There is at least one busbar on or adjacent the first surface of the insulative plate which can electrically contact a first plurality of insulated wires. For this purpose, the busbar has one or more pressure connection sections, each of which includes a pair of blades which cut through the insulation on the wires to make electrical contact with the core thereof. There is a plurality of openings extending through the base insulative plates in line with the points on the wires at which electrical contacts are desired.

The busbars are bent so that they are in alignment with the predetermined points and the plurality of openings giving access thereto. The bent portions of the busbars form connection sections which, when the box is assembled, extend through the openings and terminate in contact blades. The blades are adapted to receive the insulated wires; when the wires are pressed therein, the blades cut through the insulation and make electrical contact with the wire core.

The insulated wires are straight, parallel to each other, and located in a wire concentration section on or adjacent the second surface of the base insulative plates. The wire concentration section is in register with the pressure connection section. Thus, since the wires are suitably aligned and closely adjacent each other, the various blades can engage the wires and make electrical contact therewith by means of a single application of pressure. Thus, all of the wires are connected at one time and it is not necessary to insert each wire individually. Preferably, all of the wires should be of the same length so that they can be easily placed in the wire concentration section. After the circuits have been formed by making the desired electrical contacts, unneeded portions of the wires are cut away and removed, thereby simplifying the final product.

In order to retain the wires on the insulative plates, pairs of wire guides are provided. These constitute protuberances extending from the second surface of the insulative plates and are spaced apart transversely to the axes of the wires by a distance which does not exceed the diameter of an individual wire. Preferably, the distance should be slightly less than the wire diameter. Some of the connection sections may extend, not only through an opening in the base insulative plate, but also through further opening(s) in one or more additional insulative plates, thereby making contact with the plurality of wires on one of the additional insulative plates.

It is also within the scope of the present Invention to provide a second plurality of insulated wires which are also straight and located within the wire concentration section. They are parallel for most of their length but cross over each other at a particular point. At least one pair of blades contacts this point under pressure to form the electrical contact with the wires. Here, too, it is advantageous if the wires are all of the same length.

In view of the complexity of the electrical systems of automobiles, a preferred form of the Invention consists of a plurality of interleaved insulative plates. These stacked plates carry either the busbar(s), the wires, or both.

In a modification of the Invention, the busbars may be spaced from the wires to which they are to be connected by one or more insulative plates. In such cases, the openings are aligned with one another and with the point at which the connections between the wires and the busbars are desired.

BRIEF DESCRIPTION OF THE DRAWINGS

In the accompanying drawings, constituting a part hereof, and in which like reference characters indicate like parts.

FIG. 2(A) is a plan view of an insulative plate having a wire concentration section;

FIG. 2(B) is a view, similar to that of FIG. 2(A) showing the underside of the insulative plate;

DETAILED DESCRIPTION OF THE INVENTION

Figure 1:
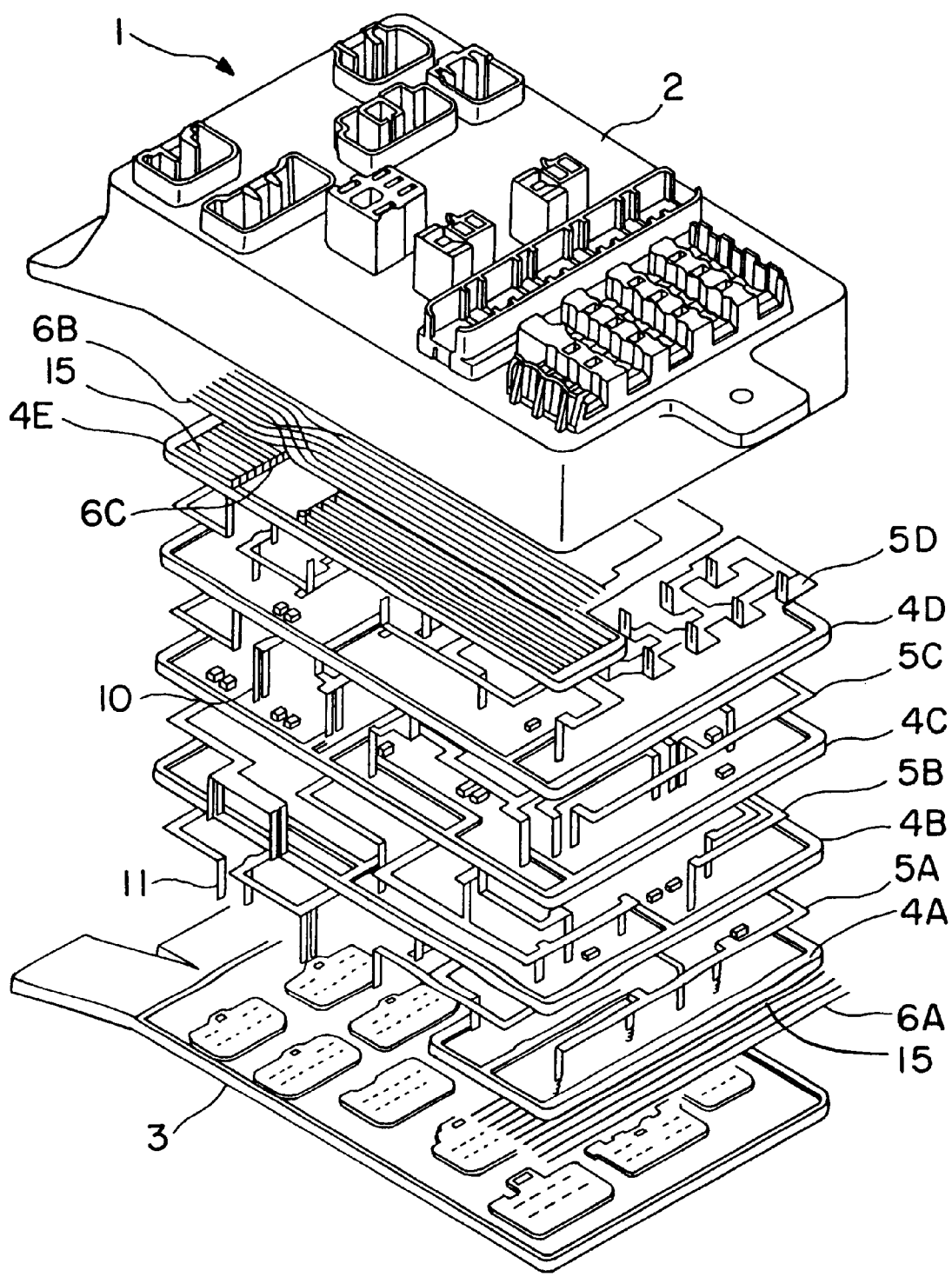
FIG. 1 is an exploded perspective view of the connection box according to the present Invention.
Figure 3:
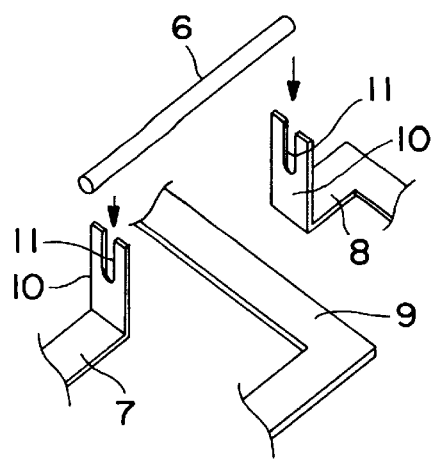
FIG. 3 is an exploded perspective view of the formation of the pressure-connection between the busbar and one of the wires according to the prior art.
Figure 4:
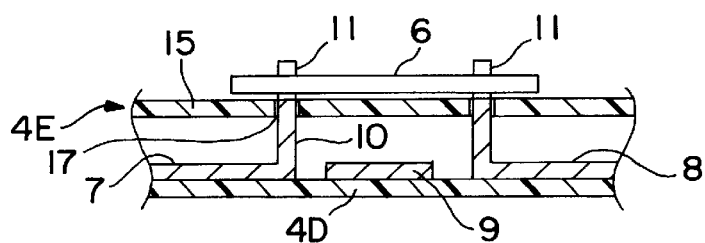
FIG. 4 is a cross section of a wire providing an intermediate connection for busbars on the same level according to the prior art.
Figure 5:
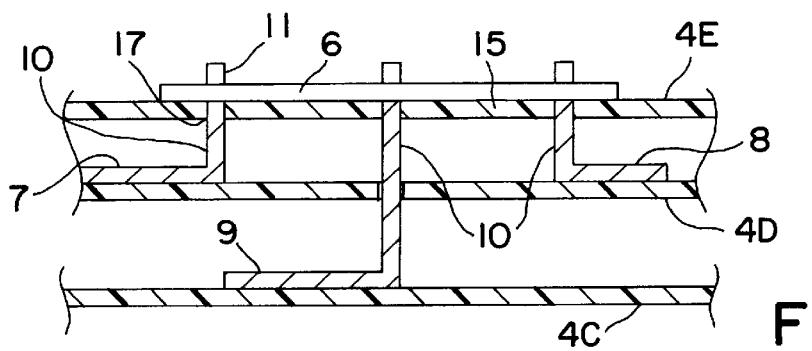
FIG. 5 is a view, similar to that of FIG. 4, wherein the connections for the busbars are on different levels according to the prior art.

As shown in FIGS. 1 and 2, connection box 1 comprises upper case 2 and lower case 3. Within the box are alternated insulator plates 4A, 4B, 4C, 4D, and 4E and busbars 5A, 5B, 5C, and 5D. Wires 6A and 6B are located in wire concentration sections 15 first plurality of wires is labeled 6A, while second plurality of the wires is labeled 6B in FIG. 1. Wires 6a, 6b, 6c, 6d, 6e, 6f, and 6g are retained on the second surface of (for example) insulative plate 4E by wire guides 16. Openings 17, through which connection sections 10 project to make contact with the wires, extend through insulative plate 4E.

Figure 6:
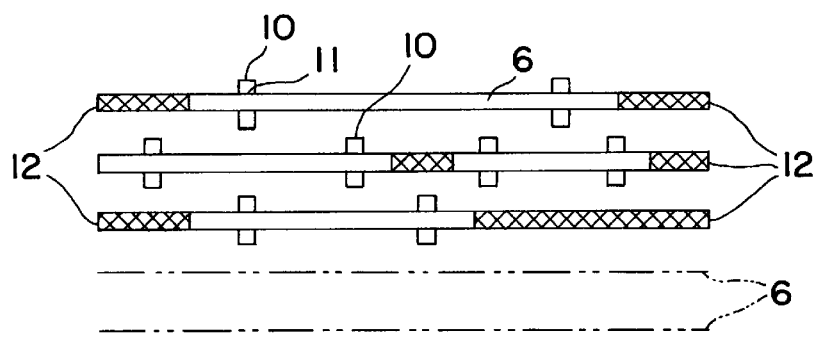
FIG. 6 is a schematic view showing the wires parallel to each other and indicating the unused portions which are to be cut off.

On the first surface of insulative plate 4E, openings 17 are provided at the predetermined contact points. Connection sections 10 terminate in blades 11 which are adapted to receive wires 6 and cut through the insulation thereon to make contact with the electrically conductive wire cores. Referring more specifically to FIG. 6, blades 11 on connection sections 10 are in electrical contact with wires 6. Unused sections 12 (cross hatched) are cut away in order to minimize the bulk of the finished connector box.

In a preferred form of the Invention, as best shown in FIG. 1, a second plurality of wires 6B is located adjacent wire concentration section 15. In particular, these wires are parallel to each other throughout most of their length, but are provided with cross over point 6c where the wires come together. Thus, if a connection is to be made to such wires, contact can be carried out quite readily.

Furthermore, the circuits can be modified simply by adding or removing connections with the wires. Furthermore, the wires used for intermediate connections for the busbars can be concentrated in the wire concentration section and preferably arranged in straight lines parallel to each other. This makes the wiring easier and the equipment necessary is readily available. Thus, the device of the present Invention is well suited for mass production and low assembly costs.

While only a limited number of specific embodiments has been expressly disclosed, it is, nonetheless, to be broadly construed and not to be limited except by the character of the claims appended hereto.

What we claim is:

1. An electrical connection box comprising:
    at least one generally planar base insulative plate having a first surface,
    at least one busbar on said first surface adapted to electrically contact a first plurality of insulated wires, said busbar having at least one pressure connection section which includes a pair of blades adapted to make electrical contact with at least one of said insulated wires,
    said insulated wires being straight, parallel to each other, and located in a wire concentration section on a second surface of said base insulative plate, said second surface being opposite said first surface,
    said wire concentration section being in register with said pressure connection section,
    openings in said base insulative plate through which said blades project,
    each of said openings having
    a pair of wire guides which are spaced apart in a direction transverse to a longitudinal axis of one of said first plurality of wires by a distance no greater than a diameter of said wires, said wire guides securing said first plurality of wires to said second side of said base insulating plate,
    whereby pressure exerted on said busbar or said insulated wires forms electrical contacts between said busbar and said plurality of wires in a single operation.

2. The electrical connection box of claim 1 wherein each of said first plurality of wires, when placed in said wire connection section, is of substantially the same length.

3. The electrical connection box of claim 2 wherein, after said electrical contacts have been made, unneeded sections of said first plurality of wires are removed.

4. The electrical connection box of claim 1 wherein there is at least one additional interleaved insulative plate carrying one said busbar and/or said first plurality of wires.

5. The electrical connection box of claim 1 comprising a second plurality of insulated wires which are straight, parallel to each other through most of their length, and located in said wire concentration section adjacent said first plurality of wires, said second plurality of wires having a point at which said wires cross each other, at least one said pair of blades forming said electrical contact with said wires at said point.

6. The electrical connection box of claim 5 wherein each of said second plurality of wires, when placed in said wire connection section, is of substantially the same length.

7. The electrical connection box of claim 4 wherein at least one of said pressure connection sections extends through an opening in said additional insulative plate, thereby making electrical contact with said first plurality of wires on said additional insulative plate.

* * * * *

UNITED STATES PATENT AND TRADEMARK OFFICE
CERTIFICATE OF CORRECTION

PATENT NO. : 6,220,875 B1
DATED : April 24, 2001
INVENTOR(S) : Kawakita It is certified that error appears in the above-identified patent and that said Letters Patent is hereby corrected as shown below:

<u>Title page,</u>

<u>Column 1,</u>
U.S. Patent No. 6,220,875, change filing date from "August 8, 1999 to
-- September 8, 1999 --

Signed and Sealed this

Second Day of October, 2001

Attest:

NICHOLAS P. GODICI
*Acting Director of the United States Patent and Trademark Office*

*Attesting Officer*